US010826318B2

(12) United States Patent
Tagawa

(10) Patent No.: US 10,826,318 B2
(45) Date of Patent: Nov. 3, 2020

(54) VOLTAGE INCREASING AND DECREASING DEVICE FOR POWER STORAGE APPARATUS AND POWER STORAGE APPARATUS

(71) Applicant: Murata Manufacturing Co., Ltd., Nagaokakyo (JP)

(72) Inventor: Shuichi Tagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/807,302

(22) Filed: Mar. 3, 2020

(65) Prior Publication Data
US 2020/0203985 A1    Jun. 25, 2020

Related U.S. Application Data

(63) Continuation of application No. PCT/JP2018/030823, filed on Aug. 21, 2018.

(30) Foreign Application Priority Data

Sep. 15, 2017    (JP) ................................ 2017-177667

(51) Int. Cl.
*H02J 7/34*    (2006.01)
*H02J 7/00*    (2006.01)
(Continued)

(52) U.S. Cl.
CPC ............ *H02J 7/34* (2013.01); *G01R 19/0023* (2013.01); *H01M 10/44* (2013.01); *H02J 1/00* (2013.01);
(Continued)

(58) Field of Classification Search
CPC ........................................................ H02J 7/34
See application file for complete search history.

(56) References Cited

U.S. PATENT DOCUMENTS 9,337,681 B2 * 5/2016 Sugiyama ............... H02J 7/027
2010/0164278 A1    7/2010 Oyobe et al.

FOREIGN PATENT DOCUMENTS

JP    2006-246610 A    9/2006
JP    2008-005658 A    1/2008
(Continued)

OTHER PUBLICATIONS

Official Communication issued in International Patent Application No. PCT/JP2018/030823, dated Sep. 25, 2018.

*Primary Examiner* — Robert Grant
(74) *Attorney, Agent, or Firm* — Keating & Bennett, LLP

(57) ABSTRACT

A power storage apparatus includes a charge and discharge controller. To start a voltage increasing operation in a state where a smoothing capacitor is not charged, the charge and discharge controller supplies a nonrestrictive current to a voltage increasing and decreasing circuit after charging the smoothing capacitor with a restrictive current. When a second direct-current voltage is supplied to a second terminal, the charge and discharge controller charges the smoothing capacitor with an increased voltage by the voltage increasing operation after charging the smoothing capacitor with the restrictive current, reduces a potential difference between the charge voltage in the smoothing capacitor and the second direct-current voltage, and then closes a switch circuit.

13 Claims, 5 Drawing Sheets

(51) Int. Cl.

| | |
|---|---|
| *G01R 19/00* | (2006.01) |
| *H01M 10/44* | (2006.01) |
| *H02J 1/00* | (2006.01) |
| *H02J 3/38* | (2006.01) |
| *H02M 3/156* | (2006.01) |
| *H02M 7/5387* | (2007.01) |
| *H02M 7/5395* | (2006.01) |

(52) U.S. Cl.
CPC .............. *H02J 3/38* (2013.01); *H02J 7/0047* (2013.01); *H02M 3/156* (2013.01); *H02M 7/5395* (2013.01); *H02M 7/53871* (2013.01)

(56) References Cited

FOREIGN PATENT DOCUMENTS

| | | |
|---|---|---|
| JP | 2011-010508 A | 1/2011 |
| WO | 2016/157962 A1 | 10/2016 |

* cited by examiner

VOLTAGE INCREASING AND DECREASING DEVICE FOR POWER STORAGE APPARATUS AND POWER STORAGE APPARATUS

CROSS REFERENCE TO RELATED APPLICATIONS

This application claims the benefit of priority to Japanese Patent Application No. 2017-177667 filed on Sep. 15, 2017 and is a Continuation Application of PCT Application No. PCT/JP2018/030823 filed on Aug. 21, 2018. The entire contents of each application are hereby incorporated herein by reference.

BACKGROUND OF THE INVENTION

1. Field of the Invention

The present invention relates to a voltage increasing and decreasing device for a power storage apparatus in a photovoltaic power generating system and to the power storage apparatus, the power storage apparatus storing power generated by the photovoltaic power generating system in a secondary battery or supplying the power stored in the secondary battery to a load unit as needed.

2. Description of the Related Art

In a photovoltaic power generating system in a general house, direct-current power generated by a photovoltaic panel is converted by an inverter inside a power conditioner into a predetermined alternating-current voltage, and it is supplied to a load unit in the house or supplied to an electric power block.

Power storage apparatuses that can store direct-current power generated by photovoltaic panels in secondary batteries and that can supply the power stored in the secondary batteries to load units inside houses through power conditioners when required have been proposed. There has also been proposed a configuration in which one example of the power storage apparatuses is designed to be attachable to and detachable from the power conditioner with a high-voltage direct-current bus line disposed therebetween and can be retrofitted to the photovoltaic power generating system for household use as needed.

In that power storage apparatus, direct-current power generated by the photovoltaic panel is supplied through the high-voltage direct-current bus line inside the power conditioner, its voltage is decreased by a bidirectional converter, and it is fed into the secondary battery. The voltage of the direct-current power stored in the secondary battery is increased by the bidirectional converter, that power is smoothed by a smoothing capacitor and is supplied to the high-voltage direct-current bus line, and it is converted into an alternating-current voltage by an inverter inside the power conditioner and is supplied to the load unit inside the house.

Such a power storage apparatus needs to prevent breakage of a semiconductor switch element in a current path by providing a switch circuit to each of between the smoothing capacitor and the secondary battery and between the smoothing capacitor and the high-voltage direct-current bus line and blocking an inrush current to the smoothing capacitor.

Specifically, when the potential difference between the charge voltage in the smoothing capacitor and that in the secondary battery is large, the switch circuit is controlled such that the charge current flowing from the secondary battery to the smoothing capacitor is restricted until that potential difference becomes sufficiently small. Similarly, when the potential difference between the charge voltage in the high-voltage direct-current bus line and that in the smoothing capacitor is large, the switch circuit is controlled such that the charge current flowing from the high-voltage direct-current bus line to the smoothing capacitor is restricted until the potential difference becomes sufficiently small. The control of the switch circuit in that way can significantly reduce or prevent the breakage of the semiconductor switch element caused by an inrush current.

In one example of the switch circuit having the above-described current restrictive function, a series circuit of a resistor as a current restrictive element and a current restrictive-side relay switch is connected in parallel with a current-nonrestrictive side relay switch. At the time of restricting the charge current, only the current-restrictive side relay switch is closed, and at the time of not restricting the charge current, the current-nonrestrictive side relay switch is closed.

With that switch circuit, entry of an inrush current into the smoothing capacitor can also be prevented when the power storage apparatus is connected to the high-voltage direct-current bus line.

Japanese Unexamined Patent Application Publication No. 2011-10508 discloses a power source system that increases each of a direct-current voltage supplied from a battery and a direct-current voltage supplied from a fuel cell by a converter, smooths the output voltage from the converter by a smoothing capacitor, and supplies it to an inverter.

In the above-described power storage apparatus, the switch circuit having the current restrictive function is disposed each of between the secondary battery and the smoothing capacitor and between the high-voltage direct-current bus line and the smoothing capacitor. The switch circuit having the current restrictive function includes two relay switches with ensured current capacitances and a resistor with a constant or substantially constant current capacitance. Because the parts cost of those elements is high, the manufacturing cost for the power source device rises.

Because the power source system disclosed in Japanese Unexamined Patent Application Publication No. 2011-10508 does not allow the fuel cell to be attachable thereto or detachable therefrom, a configuration that prevents the occurrence of an inrush current when the power source device is connected is not disclosed.

SUMMARY OF THE INVENTION

Preferred embodiments of the present invention provide voltage increasing and decreasing devices for power storage apparatuses and power storage apparatuses, the power storage apparatuses each being able to significantly reducing or preventing a rise in parts cost and able to reduce or prevent the occurrence of an inrush current to a smoothing capacitor.

A voltage increasing and decreasing device for a power storage apparatus according to a preferred embodiment of the present invention includes a voltage increasing and decreasing circuit, a smoothing capacitor, a current selection circuit, a switch circuit, and a charge and discharge controller. The voltage increasing and decreasing circuit performs a voltage increasing operation of increasing a first direct-current voltage on a low-voltage side supplied to a first terminal by PWM (pulse width modulation) control and of outputting it to a second terminal and performs a voltage decreasing operation of decreasing a second direct-current voltage on a high-voltage side supplied to the second terminal by the PWM control and of outputting it to the first terminal. The smoothing capacitor is electrically connected between the second terminal and the voltage increasing and decreasing circuit and smooths the output increased voltage from the voltage increasing and decreasing circuit. The current selection circuit is provided between the first terminal and the voltage increasing and decreasing circuit and switches a charge current to be supplied to the smoothing capacitor between a restrictive current and a nonrestrictive current. The switch circuit is provided between the smoothing capacitor and the second terminal. To start the voltage increasing operation in a state where the smoothing capacitor is not charged, the charge and discharge controller supplies the nonrestrictive current to the voltage increasing and decreasing circuit after charging the smoothing capacitor with the restrictive current. When the second direct-current voltage is supplied to the second terminal, the charge and discharge controller charges the smoothing capacitor with the increased voltage by the voltage increasing operation after charging the smoothing capacitor with the restrictive current, reduces a potential difference between the charge voltage in the smoothing capacitor and the second direct-current voltage, and then closes the switch circuit.

In a preferred embodiment of the present invention, to start the voltage increasing operation in the state where the smoothing capacitor is not charged, the voltage increasing operation is started after the smoothing capacitor is charged with the restrictive current; when the second direct-current voltage is supplied to the second terminal, the smoothing capacitor is charged with the increased voltage by the voltage increasing operation after the smoothing capacitor is charged with the restrictive current, the potential difference between the charge voltage in the smoothing capacitor and the second direct-current voltage is reduced, and then, the switch circuit is closed. Therefore, the occurrence of an inrush current to the smoothing capacitor is able to be reduced or prevented.

A power storage apparatus according to a preferred embodiment of the present invention includes a chargeable and dischargeable secondary battery, a voltage increasing and decreasing circuit, a smoothing capacitor, a current selection circuit, a switch circuit, and a charge and discharge controller. The voltage increasing and decreasing circuit performs a voltage increasing operation of increasing a first direct-current voltage on a low-voltage side supplied from the secondary battery by PWM control and of outputting it to a high-voltage direct-current bus line through a connector and performs a voltage decreasing operation of decreasing a second direct-current voltage on a high-voltage side supplied from the high-voltage direct-current bus line to the connector by the PWM control and of outputting it to the secondary battery. The smoothing capacitor is electrically connected between the connector and the voltage increasing and decreasing circuit and smooths the output increased voltage from the voltage increasing and decreasing circuit. The current selection circuit is provided between the secondary battery and the voltage increasing and decreasing circuit and switches a charge current to be supplied to the smoothing capacitor between a restrictive current and a nonrestrictive current. The switch circuit is provided between the smoothing capacitor and the high-voltage direct-current bus line. To start the voltage increasing operation in a state where the smoothing capacitor is not charged, the charge and discharge controller supplies the nonrestrictive current to the voltage increasing and decreasing circuit after charging the smoothing capacitor with the restrictive current. When the second direct-current voltage is supplied from the high-voltage direct-current bus line to the connector, the charge and discharge controller charges the smoothing capacitor with the increased voltage by the voltage increasing operation after charging the smoothing capacitor with the restrictive current, reduces a potential difference between the charge voltage in the smoothing capacitor and the second direct-current voltage, and then closes the switch circuit.

In a preferred embodiment of the present invention, to start the voltage increasing operation in the state where the smoothing capacitor is not charged, the voltage increasing operation is started after the smoothing capacitor is charged with the restrictive current; when the second direct-current voltage is supplied to the high-voltage direct-current bus line, the smoothing capacitor is charged with the increased voltage by the voltage increasing operation after the smoothing capacitor is charged with the restrictive current, the potential difference between the charge voltage in the smoothing capacitor and the second direct-current voltage is reduced, and then, the switch circuit is closed. Therefore, the occurrence of an inrush current to the smoothing capacitor can be prevented.

In the above-described power storage apparatus, the switch circuit may preferably include a relay switch provided between the connector and the smoothing capacitor.

In a preferred embodiment of the present invention, when the switch circuit is closed, the output voltage from the smoothing capacitor is supplied to the high-voltage direct-current bus line or the second direct-current voltage is supplied from the high-voltage direct-current bus line to the voltage increasing and decreasing circuit.

In the above-described power storage apparatus, the current selection circuit may preferably include a series circuit of a restrictive-current side relay switch and a resistor and a nonrestrictive-current side relay switch electrically connected in parallel with the series circuit, and the charge and discharge controller may preferably close only the restrictive-current side relay switch to supply the restrictive current to the smoothing capacitor.

In a preferred embodiment of the present invention, when only the restrictive-current side relay switch is closed, the restrictive current is supplied to the smoothing capacitor, and when the nonrestrictive-side relay switch is closed, the nonrestrictive current is supplied to the smoothing capacitor.

The above-described power storage apparatus may further preferably include a charge-voltage detecting voltmeter that detects the charge voltage in the smoothing capacitor and a high-voltage detecting voltmeter that detects the second direct-current voltage. The charge and discharge controller may preferably close, for example, the switch circuit on the basis of reduction in a potential difference between a detected voltage by the charge-voltage detecting voltmeter and a detected voltage by the high-voltage detecting voltmeter.

In a preferred embodiment of the present invention, when the potential difference between the detected voltage by the charge-voltage detecting voltmeter and the detected voltage by the high-voltage detecting voltmeter is reduced, the switch circuit is closed, and the second direct-current voltage is supplied to the voltage increasing and decreasing circuit.

In the above-described power storage apparatus, the voltage increasing and decreasing circuit may preferably supply the charge current from the current selection circuit to the smoothing capacitor through a coil and a body diode in a transistor.

In a preferred embodiment of the present invention, the charge current is supplied from the current selection circuit to the smoothing capacitor through the coil and the body diode in the transistor in the voltage increasing and decreasing circuit.

According to the voltage increasing and decreasing devices for the power storage apparatus and the power storage apparatuses in preferred embodiments of the present invention, an increase in parts cost can be significantly reduced or prevented, and the occurrence of an inrush current to the smoothing capacitor can be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

Figure 1:
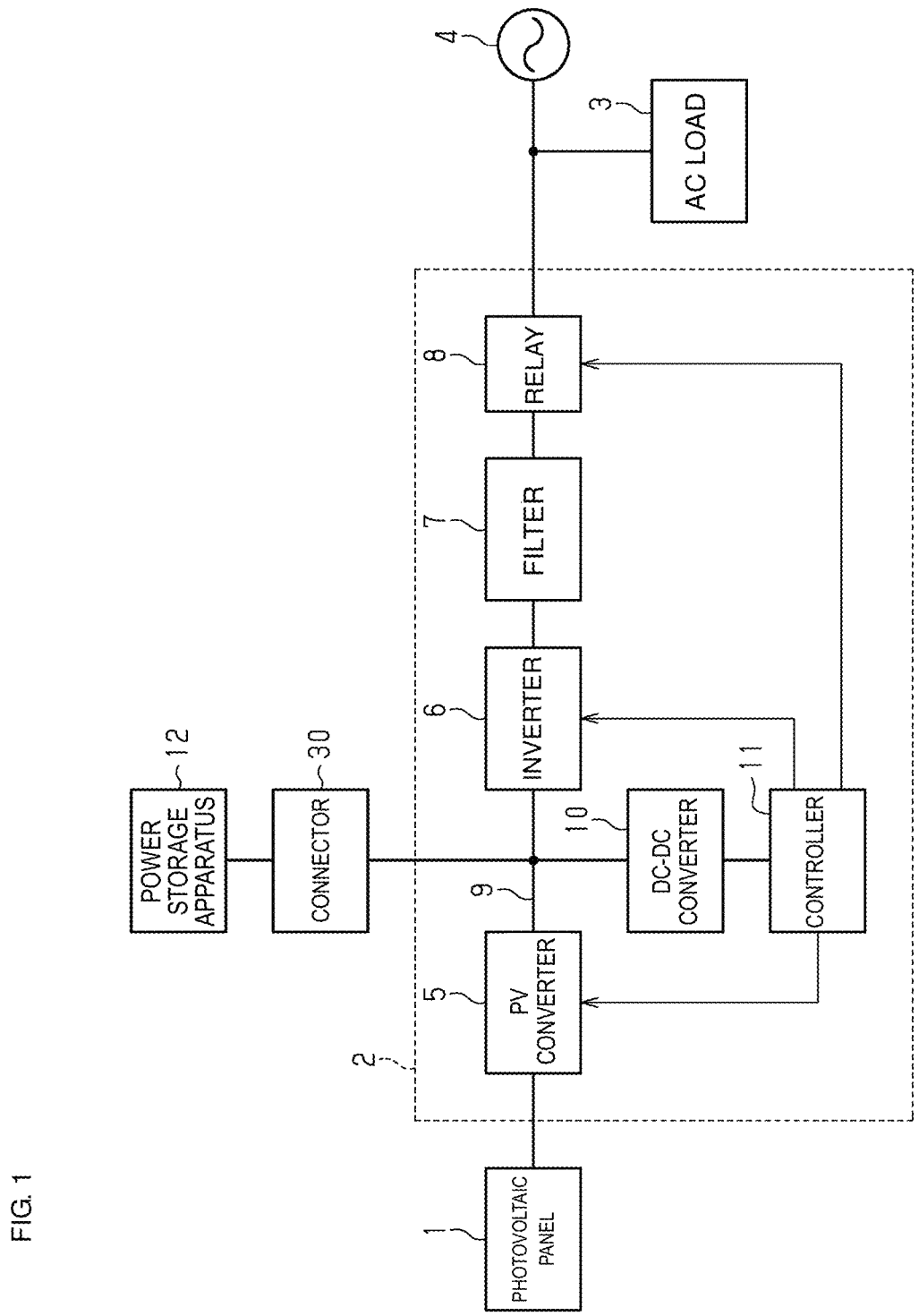
FIG. 1 is a block diagram that shows a photovoltaic power generating system according to a preferred embodiment of the present invention.

In a photovoltaic power generating system according to a preferred embodiment of the present invention for general household use shown in FIG. 1, direct-current power generated by a photovoltaic panel 1 is converted into commercial alternating-current power by a power conditioner 2, and it is supplied to an alternating-current load 3 inside the house or a commercial electric power block 4.

Specifically, the voltage of power generated by the photovoltaic panel 1 is increased by a PV converter 5, and it is converted into an alternating-current voltage by an inverter 6. A high frequency component produced by the conversion operation by the inverter 6 is removed by a filter 7, and the remaining component is supplied to the alternating-current load 3 or commercial electric power block 4 through a relay 8.

A high-voltage direct-current bus line 9 through which high-voltage direct-current power is supplied from the PV converter 5 to the inverter 6 is electrically connected to a DC-DC converter 10. The DC-DC converter 10 outputs, to a controller 11, a direct-current voltage in which the output voltage from the PV converter 5 is decreased.

The controller 11 operates with the direct-current output voltage from the DC-DC converter 10 as a power source and controls the voltage increasing operation by the PV converter 5, the conversion operation by the inverter 6, and the opening and closing operation in the relay 8.

The power conditioner 2 includes the above-described PV converter 5, inverter 6, filter 7, relay 8, DC-DC converter 10, and controller 11.

The power conditioner 2 allows a power storage apparatus 12 to be electrically connected thereto with a connector 30. The power storage apparatus 12 is attachable to and detachable from the power conditioner 2. When the power storage apparatus 12 is electrically connected to the power conditioner 2 with the connector 30 provided therebetween, the power storage apparatus 12 is electrically connected to the high-voltage direct-current bus line (HVDC bus) 9. In the present preferred embodiment, when the photovoltaic panel 1 generates power, the power conditioner 2 outputs a direct-current voltage of about 360 volts, for example, to the high-voltage direct-current bus line 9.

Figure 2:
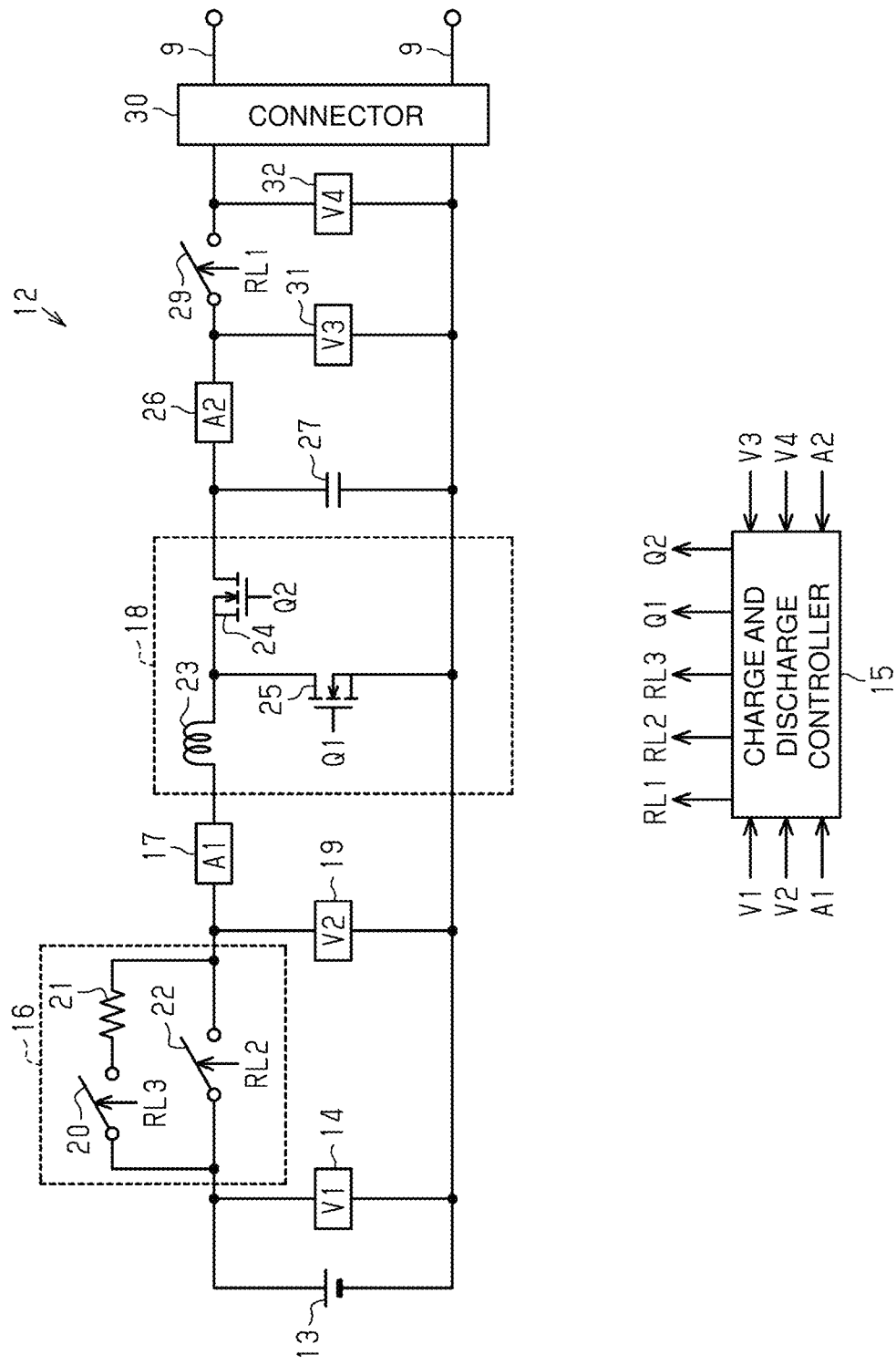
FIG. 2 is a circuit diagram that shows a power storage apparatus according to a preferred embodiment of the present invention.

A non-limiting example of a configuration of the power storage apparatus 12 is described with reference to FIG. 2. A first voltmeter 14 is electrically connected between a positive-side terminal and a negative-side terminal of a secondary battery 13, which may preferably be, for example, a lithium-ion battery. The first voltmeter 14 detects the voltage between the terminals of the secondary battery 13 (first direct-current voltage) and outputs that detected voltage value V1 to a charge and discharge controller 15. In the present preferred embodiment, the secondary battery 13 in a charged state outputs a direct-current voltage of about 300 volts, for example.

The positive-side terminal (first terminal) of the secondary battery 13 is electrically connected to a voltage increasing and decreasing circuit 18 with a current selection circuit 16 and a first ammeter 17 provided therebetween. A second voltmeter 19 is electrically connected between a terminal of the current selection circuit 16 near the first ammeter 17 and the negative-side terminal of the secondary battery 13. The second voltmeter 19 detects the output voltage from the current selection circuit 16 and outputs that detected voltage value V2 to the charge and discharge controller 15.

The first ammeter 17 detects the current flowing between the current selection circuit 16 and the voltage increasing and decreasing circuit 18 and outputs that detected current value A1 to the charge and discharge controller 15.

In the current selection circuit 16, a second relay switch 22 is electrically connected in parallel with a series circuit of a third relay switch 20 and a resistor 21. The opening and closing of the third relay switch 20 and the second relay switch 22 is controlled by control signals RL3 and RL2 output from the charge and discharge controller 15.

When only the third relay switch 20 is closed (conduction state), a charge current flowing from the secondary battery 13 through the current selection circuit 16 toward the voltage increasing and decreasing circuit 18 is restricted by the resistor 21. When the second relay switch 22 is closed, a discharge current flowing from the secondary battery 13 through the current selection circuit 16 toward the voltage increasing and decreasing circuit 18 is not restricted.

The voltage increasing and decreasing circuit 18 includes a coil 23 and transistors 24 and 25 (preferably FETs, for example) and is provided between the first ammeter 17, a second ammeter 26, and a smoothing capacitor 27. The coil 23 and the transistor 24 are electrically connected in series between the first ammeter 17, second ammeter 26, and a positive-side terminal of the smoothing capacitor 27. The transistor 25 is electrically connected between a junction of the coil 23 and the transistor 24 and the negative-side terminal of the secondary battery 13. A negative-side terminal of the smoothing capacitor 27 is electrically connected to the negative-side terminal of the secondary battery 13.

Control signals Q1 and Q2 are input from the charge and discharge controller 15 into the gate of the transistor 24 and 25. The charge and discharge controller 15 causes the transistors 24 and 25 to be turned on or off alternately by PWM (pulse width modulation) control, controls its pulse width, and causes the voltage increasing and decreasing circuit 18 to perform a voltage increasing operation or voltage decreasing operation.

Specifically, in the voltage increasing operation, the voltage increasing and decreasing circuit 18 increases the direct-current voltage supplied from the secondary battery 13 through the first ammeter 17 and supplies it to the smoothing capacitor 27. In the voltage decreasing operation, the voltage increasing and decreasing circuit 18 decreases the charge voltage in the smoothing capacitor 27 and supplies it to the secondary battery 13.

The positive-side terminal of the smoothing capacitor 27 is electrically connected to the second ammeter 26 to a first relay switch 29 to a positive-side terminal (second terminal) of the connector 30. The smoothing capacitor 27 is electrically connected in parallel with a third voltmeter 31. A fourth voltmeter 32 is electrically connected between the positive-side terminal and a negative-side terminal of the connector 30.

The opening and closing of the first relay switch 29 is controlled by a control signal RL1 output from the charge and discharge controller 15. The second ammeter 26 detects the current flowing between the positive-side terminal of the smoothing capacitor 27 and the positive-side terminal of the connector 30 and outputs that detected current value A2 to the charge and discharge controller 15.

The third voltmeter 31 detects the charge voltage in the smoothing capacitor 27 and outputs that detected voltage value V3 to the charge and discharge controller 15. The fourth voltmeter 32 detects the voltage between the terminals of the positive-side terminal and negative-side terminal of the connector 30, that is, the voltage supplied from the high-voltage direct-current bus line 9 toward the power storage apparatus 12 (second direct-current voltage) and outputs that detected voltage value V4 to the charge and discharge controller 15.

The charge and discharge controller 15 can communicate with the power conditioner 2 by connection of the connector 30. In one example, the charge and discharge controller 15 may be activated in response to an action of an activation switch in the power storage apparatus 12 and operate under a preset program based on communication with the power conditioner 2.

When being activated, the charge and discharge controller 15 controls the opening and closing of the first to third switches 20, 22, and 29 to significantly reduce or prevent an inrush current to flow into the smoothing capacitor 27 on the basis of the detected voltage values by the first to fourth voltmeters 14, 19, 31, and 32.

Next, workings and operations of the above-described photovoltaic power generating system and the charge and discharge controller 15 are described with reference to FIGS. 3 to 6.

First Case

A first case is the case where in a state in which no voltage is applied to the high-voltage direct-current bus line 9, the power storage apparatus 12 is electrically connected to the high-voltage direct-current bus line 9, and the voltage in the high-voltage direct-current bus line 9 is increased.

Figure 3:
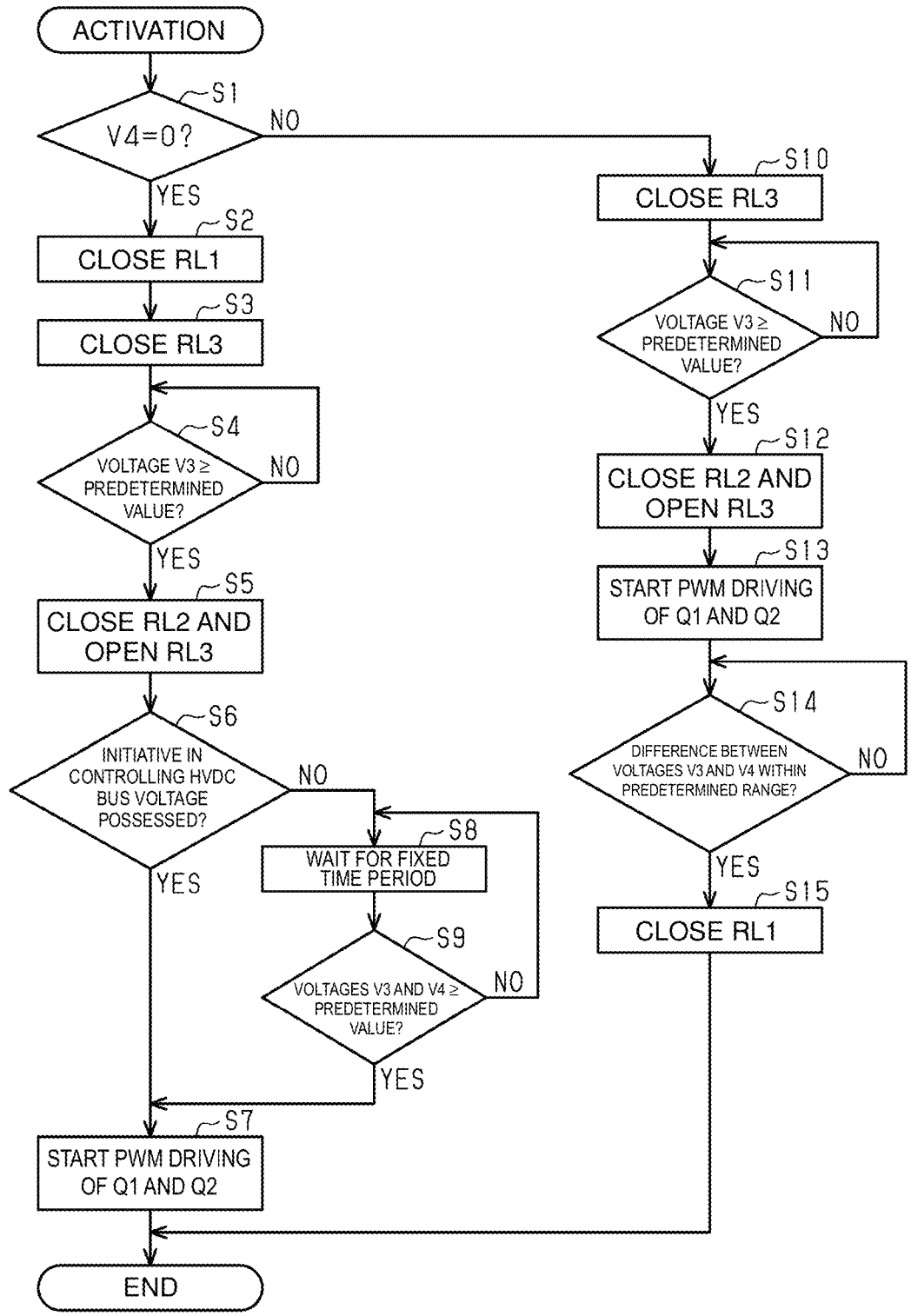
FIG. 3 is a flow chart that shows operations of a charge and discharge controller according to a preferred embodiment of the present invention.

As shown in FIG. 3, when the charge and discharge controller 15 is activated in response to an activation signal, the charge and discharge controller 15 determines whether the detected voltage value V4 by the fourth voltmeter 32 is zero or not (step S1). That is, it determines whether the voltage in the high-voltage direct-current bus line 9 is zero or not.

When the detected voltage value V4 is zero, the charge and discharge controller 15 closes the first relay switch 29 (step S2), and after that, it closes the third relay switch 20 (step S3).

Figure 4:
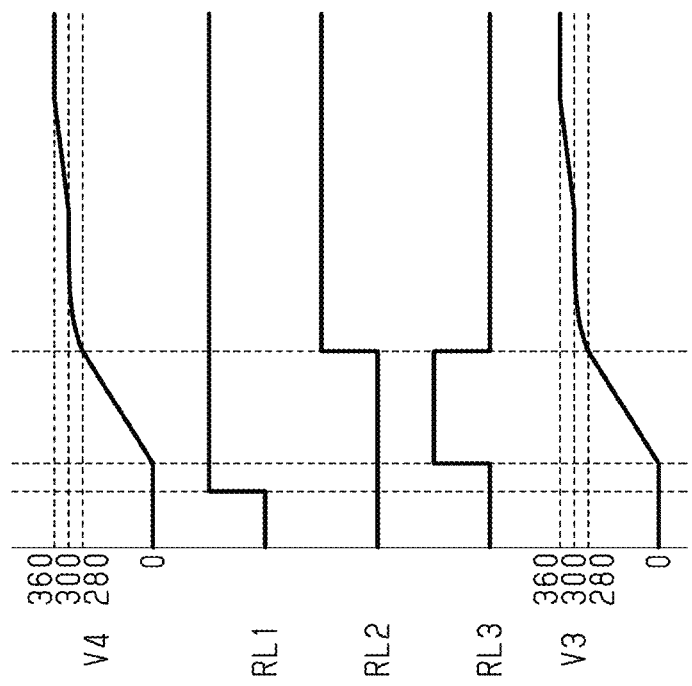
FIG. 4 shows timing waveforms that express operations of a power storage apparatus according to a preferred embodiment of the present invention.

As shown in FIG. 4, a current is supplied from the secondary battery 13 through the third relay switch 20 and the resistor 21 to the voltage increasing and decreasing circuit 18, the current being restricted by the resistor 21. The supplied current in the voltage increasing and decreasing circuit 18 is supplied through the coil 23 and the body diode in the transistor 24 to the smoothing capacitor 27. Because the current restricted by the resistor 21 is supplied to the smoothing capacitor 27, no inrush current flows in the smoothing capacitor 27.

Thus, the detected voltage value V3 by the third voltmeter 31, that is, the charge voltage in the smoothing capacitor 27 gently increases.

After that, when the detected voltage value V3 by the third voltmeter 31 reaches a predetermined value, here, about 280 volts, for example, the third relay switch 20 is opened (nonconduction state), and the second relay switch 22 is closed (step S5).

Then, a current is supplied from the secondary battery through the second relay switch 22, the coil 23, and the transistor 24 to the smoothing capacitor 27 without being restricted by the resistor 21, and the smoothing capacitor 27 is charged to about 300 volts, for example. At that time, because the potential difference between the output voltage from the secondary battery 13 and the charge voltage in the smoothing capacitor 27 is small, no inrush current flows in the smoothing capacitor 27.

After that, when the charge and discharge controller 15 possesses the initiative in controlling the voltage in the high-voltage direct-current bus line 9 for the power conditioner 2, the process moves from step S6 to step S7, where the charge and discharge controller 15 performs the PWM control on the transistors 24 and 25 in the voltage increasing and decreasing circuit 18. Then, an increased voltage of, for example, about 360 volts is supplied from the power storage apparatus 12 to the high-voltage direct-current bus line 9.

Second Case

Figure 5:
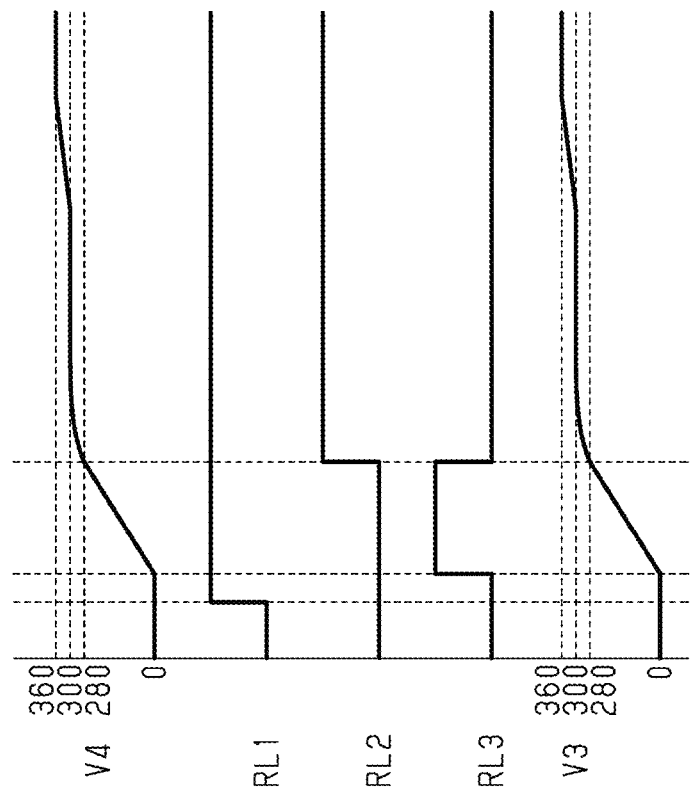
FIG. 5 shows timing waveforms that express operations of a power storage apparatus according to a preferred embodiment of the present invention.

A second case is shown in FIG. 5 and is the case where the charge and discharge controller 15 does not possess the initiative in controlling the voltage for the power conditioner 2 at step S6.

When at step S6 the charge and discharge controller 15 does not possess the initiative in controlling the voltage for the power conditioner 2, the process moves to step S8, where the PWM control by the charge and discharge controller 15 on the voltage increasing and decreasing circuit 18 waits for a fixed time period. After that, when the detected voltage value V3 by the third voltmeter 31 and the detected voltage value V4 by the fourth voltmeter 32 become equal to or larger than a predetermined value (here, about 300 volts, for example), the process moves to step S7, where the PWM control is performed on the transistors 24 and 25 in the voltage increasing and decreasing circuit 18.

Then, the voltage in the high-voltage direct-current bus line 9 is increased by the power storage apparatus 12 to, for example, about 360 volts. At step S8, the PWM control may be started in response to a drive signal output from the power conditioner 2 without a wait for a fixed time period.

Third Case

Figure 6:
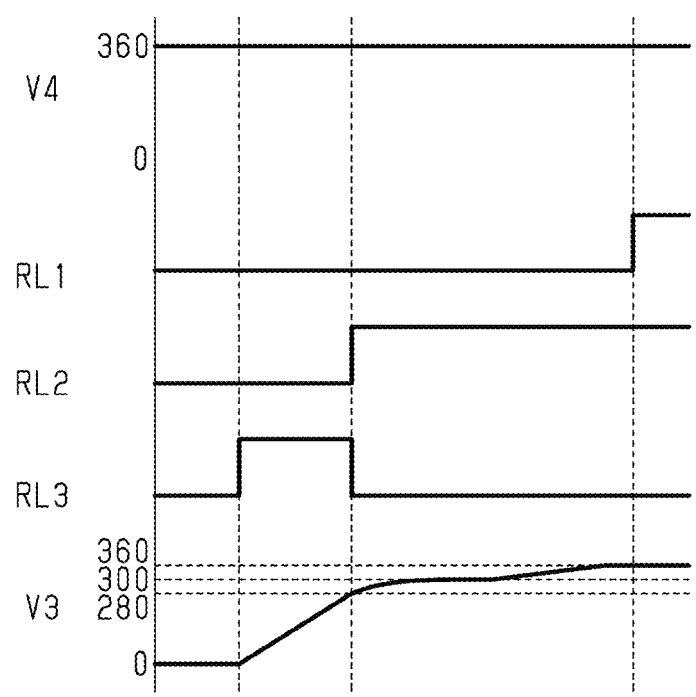
FIG. 6 shows timing waveforms that express operations of a power storage apparatus according to a preferred embodiment of the present invention.

FIG. 6 shows a third case. The third case is the case where in a state in which high voltage is supplied from the power conditioner 2 to the high-voltage direct-current bus line 9, the power storage apparatus 12 is electrically connected to the high-voltage direct-current bus line 9.

When at step S1 the detected voltage value V4 by the fourth voltmeter 32, that is, the voltage in the high-voltage direct-current bus line 9 is not zero and may be, for example, about 360 volts, the process moves to step S10, where the charge and discharge controller 15 closes the third relay switch 20. Then, as in the above-described first case, a current restricted by the resistor 21 is supplied to the smoothing capacitor 27, the smoothing capacitor 27 is charged therewith, and the detected voltage value V3 by the third voltmeter 31, that is, the charge voltage in the smoothing capacitor 27 increases.

Then, when the detected voltage value V3, that is, the charge voltage in the smoothing capacitor 27 reaches a predetermined value (here, about 280 volts, for example) or above, the charge and discharge controller 15 closes the second relay switch 22 and opens the third relay switch 20 (steps S11 and S12).

After that, the charge and discharge controller 15 starts the PWM control on the transistors 24 and 25, increases the output voltage from the secondary battery 13, and supplies it to the smoothing capacitor 27 (step S13). Then, when the potential difference between the detected voltage value V3 by the third voltmeter 31 and the detected voltage value V4 by the fourth voltmeter 32 falls within a predetermined range (here, becomes equal or substantially equal to the voltage in the high-voltage direct-current bus line 9), the charge and discharge controller 15 closes the first relay switch 29 (steps S14 and S15) and ends the operation.

The power storage apparatus having the above-described configuration in the photovoltaic power generating system can provide the advantages described below.

(1) When the power storage apparatus 12 is electrically connected to the high-voltage direct-current bus line 9 with the connector 30 provided therebetween or when the power storage apparatus 12 connected to the high-voltage direct-current bus line 9 is activated, the entry of an inrush current into the smoothing capacitor 27 in the power storage apparatus 12 can be prevented. Accordingly, the breakage of the first relay switch 29 or the transistor 24 caused by an inrush current can be prevented.

(2) When a direct-current high voltage in which the direct-current voltage in the secondary battery 13 is increased is supplied from the power storage apparatus 12 to the high-voltage direct-current bus line 9 in the state where no voltage is applied to the high-voltage direct-current bus line 9, in advance of activation of the voltage increasing and decreasing circuit 18, the charge current is supplied from the secondary battery 13 through the third relay switch 20 and resistor 21 to the smoothing capacitor 27, and the smoothing capacitor 27 is charged with the charge current, whose current value upper limit is restricted. Accordingly, the occurrence of an inrush current flowing from the secondary battery 13 to the smoothing capacitor 27 can be reduced or prevented.

(3) When the charge voltage in the smoothing capacitor 27 reaches about 280 volts, for example, the charge current whose upper limit is not restricted is supplied through the second relay switch 22 to the voltage increasing and decreasing circuit 18 and the smoothing capacitor 27. Then, when the charge voltage in the smoothing capacitor 27 becomes close to the output voltage from the secondary battery 13, the voltage increasing operation by the voltage increasing and decreasing circuit 18 starts, the output voltage from the voltage increasing and decreasing circuit 18 is smoothed by the smoothing capacitor 27, and it is output as a direct-current voltage of about 360 volts, for example, to the high-voltage direct-current bus line 9. Accordingly, at the time of starting the operation by the voltage increasing and decreasing circuit 18, because the potential difference between the output voltage from the voltage increasing and decreasing circuit 18 and the charge voltage in the smoothing capacitor 27 is small, the occurrence of an inrush current flowing from the voltage increasing and decreasing circuit 18 to the smoothing capacitor 27 can be reduced or prevented.

(4) When the power storage apparatus 12 is activated in the state where a direct-current high voltage of about 360 volts, for example, is applied to the high-voltage direct-current bus line 9, the smoothing capacitor 27 is charged with the charge current supplied from the secondary battery 13 through the third relay switch 20 and resistor 21, the upper limit of the current value of the charge current being restricted. When the potential difference between the charge potential in the smoothing capacitor 27 and the potential in the high-voltage direct-current bus line 9 falls within a predetermined range, the first relay switch 29 can be closed, and the smoothing capacitor 27 can be connected to the high-voltage direct-current bus line 9. Accordingly, the occurrence of an inrush current flowing from the high-voltage direct-current bus line 9 to the smoothing capacitor 27 can be reduced or prevented.

(5) When the voltage increasing and decreasing circuit 18 performs the voltage decreasing operation in the state where a direct-current high voltage of about 360 volts is supplied from the high-voltage direct-current bus line 9 to the smoothing capacitor 27, the secondary battery 13 can be charged with a direct-current voltage of about 300 volts, for example.

(6) Without connection of the first relay switch 29 in parallel with a current restrictive circuit corresponding to the third relay switch 20 and the resistor 21, the occurrence of an inrush current from the high-voltage direct-current bus line 9 to the smoothing capacitor 27 can be prevented. Accordingly, because it is not necessary to connect the first relay switch 29 in parallel with a relay switch and a resistor, the parts cost of the power storage apparatus 12 can be reduced, and the power storage apparatus 12 can be reduced in overall size.

The above preferred embodiment may be modified as described below.

The third relay switch 20 may be a semiconductor switch.

The charge and discharge controller 15 may include, for example, one or more memories that store computer-readable instructions to provide various kinds of control described in the above-described preferred embodiment and one or more processors that execute the computer-readable instructions. The charge and discharge controller 15 may be an integrated circuit, for example, an application-specific integrated circuit (ASIC).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A voltage increasing and decreasing device for a power storage apparatus, the voltage increasing and decreasing device comprising:
 a voltage increasing and decreasing circuit that performs a voltage increasing operation of increasing a first direct-current voltage on a low-voltage side supplied to a first terminal by PWM control and of outputting the increased first direct-current voltage to a second terminal, and that performs a voltage decreasing operation of decreasing a second direct-current voltage on a high-voltage side supplied to the second terminal by the PWM control and of outputting the decreased second direct-current voltage to the first terminal;
 a smoothing capacitor electrically connected between the second terminal and the voltage increasing and decreasing circuit, and that smooths the output increased voltage from the voltage increasing and decreasing circuit;
 a current selection circuit provided between the first terminal and the voltage increasing and decreasing circuit, and that switches a charge current to be supplied to the smoothing capacitor between a restrictive current and a nonrestrictive current;
 a switch circuit provided between the smoothing capacitor and the second terminal; and
 a charge and discharge controller; wherein
 to start the voltage increasing operation in a state where the smoothing capacitor is not charged, the charge and discharge controller supplies the nonrestrictive current to the voltage increasing and decreasing circuit after charging the smoothing capacitor with the restrictive current, and when the second direct-current voltage is supplied to the second terminal, the charge and discharge controller charges the smoothing capacitor with the increased voltage by the voltage increasing operation after charging the smoothing capacitor with the restrictive current, reduces a potential difference between the charge voltage in the smoothing capacitor and the second direct-current voltage, and then closes the switch circuit.

2. A power storage apparatus comprising:
 a chargeable and dischargeable secondary battery;
 a voltage increasing and decreasing circuit that performs a voltage increasing operation of increasing a first direct-current voltage on a low-voltage side supplied from the secondary battery by PWM control and of outputting the increased first direct-current voltage to a high-voltage direct-current bus line through a connector, and that performs a voltage decreasing operation of decreasing a second direct-current voltage on a high-voltage side supplied from the high-voltage direct-current bus line to the connector by the PWM control and of outputting the decreased second direct-current voltage to the secondary battery;
 a smoothing capacitor electrically connected between the connector and the voltage increasing and decreasing circuit, and that smooths the output increased voltage from the voltage increasing and decreasing circuit;
 a current selection circuit provided between the secondary battery and the voltage increasing and decreasing circuit, and that switches a charge current to be supplied to the smoothing capacitor between a restrictive current and a nonrestrictive current;
 a switch circuit provided between the smoothing capacitor and the high-voltage direct-current bus line; and
 a charge and discharge controller; wherein
 to start the voltage increasing operation in a state where the smoothing capacitor is not charged, the charge and discharge controller supplies the nonrestrictive current to the voltage increasing and decreasing circuit after charging the smoothing capacitor with the restrictive current, and when the second direct-current voltage is supplied from the high-voltage direct-current bus line to the connector, the charge and discharge controller charges the smoothing capacitor with the increased voltage by the voltage increasing operation after charging the smoothing capacitor with the restrictive current, reduces a potential difference between the charge voltage in the smoothing capacitor and the second direct-current voltage, and then closes the switch circuit.

3. The power storage apparatus according to claim 2, wherein the switch circuit includes a relay switch provided between the connector and the smoothing capacitor.

4. The power storage apparatus according to claim 2, wherein
 the current selection circuit includes a series circuit of a restrictive-current side relay switch and a resistor and a nonrestrictive-current side relay switch electrically connected in parallel with the series circuit; and
 the charge and discharge controller closes only the restrictive-current side relay switch to supply the restrictive current to the smoothing capacitor.

5. The power storage apparatus according to claim 2, further comprising:
 a charge-voltage detecting voltmeter that detects the charge voltage in the smoothing capacitor; and
 a high-voltage detecting voltmeter that detects the second direct-current voltage; wherein
 the charge and discharge controller closes the switch circuit on the basis of reduction in a potential difference between a detected voltage by the charge-voltage detecting voltmeter and a detected voltage by the high-voltage detecting voltmeter.

6. The power storage apparatus according to claim 2, wherein the voltage increasing and decreasing circuit supplies the charge current from the current selection circuit to the smoothing capacitor through a coil and a body diode in a transistor.

7. A power generating system, comprising:
 a direct-current power source;
 a power conditioner;
 an alternating-current output terminal; and
 the power storage apparatus according to claim 2.

8. The power generating system according to claim 7, wherein the direct-current power source is a photovoltaic panel.

9. The power generating system according to claim 7, wherein
 the power conditioner includes:
  a voltage-increasing converter electrically connected to the direct-current power source;
  a voltage inverter;
  a filter; and
  a relay electrically connected to the alternating-current output terminal; and
 the voltage-increasing converter, the voltage inverter, the filter, and the relay are electrically connected in series.

10. The power generating system according to claim 7, wherein the charge and discharge controller communicates with the power conditioner via the connector.

11. The power storage apparatus according to claim 2, further comprising:
   a first voltmeter electrically connected between a positive-side terminal and a negative-side terminal of the secondary battery; and
   a second voltmeter electrically connected between the current selection circuit and the negative-side terminal of the secondary battery; wherein
   a first voltage detected by the first voltmeter and a second voltage detected by the second voltmeter are output to the charge and discharge controller.

12. The power storage apparatus according to claim 11, further comprising:
   a third voltmeter electrically connected in parallel with the smoothing capacitor; and
   a fourth voltmeter electrically connected between a positive-side terminal of the connector and a negative-side terminal of the connector; wherein
   a third voltage detected by the third voltmeter and a fourth voltage detected by the fourth voltmeter are output to the charge and discharge controller.

13. The power storage apparatus according to claim 2, further comprising:
   a first ammeter that detects a current flowing between the current selection circuit and the voltage increasing and decreasing circuit; and
   a second ammeter that detects a current following between a positive-side terminal of the smoothing capacitor and a positive-side terminal of the connector; wherein
   a first current detected by the first ammeter and a second current detected by the first ammeter are output to the charge and discharge controller.

* * * * *